(12) United States Patent
Reinmuth (10) Patent No.: US 12,252,394 B2
(45) Date of Patent: Mar. 18, 2025

(54) MICROMECHANICAL COMPONENT FOR A SENSOR DEVICE

(71) Applicant: Robert Bosch GmbH, Stuttgart (DE)

(72) Inventor: Jochen Reinmuth, Reutlingen (DE)

(73) Assignee: ROBERT BOSCH GMBH, Stuttgart (DE)

( * ) Notice: Subject to any disclaimer, the term of this patent is extended or adjusted under 35 U.S.C. 154(b) by 323 days.

(21) Appl. No.: 17/570,167

(22) Filed: Jan. 6, 2022

(65) Prior Publication Data
US 2022/0250901 A1 Aug. 11, 2022

(30) Foreign Application Priority Data

Jan. 13, 2021 (DE) ...................... 10 2021 200 235.8

(51) Int. Cl.
*B81B 3/00* (2006.01)
*B81C 1/00* (2006.01)

(52) U.S. Cl.
CPC ........ *B81B 3/0086* (2013.01); *B81C 1/00698* (2013.01); *B81B 2203/04* (2013.01)

(58) Field of Classification Search
CPC .............. B81B 3/0086; B81B 2203/04; B81B 2201/0242; B81B 2203/0118; B81B 3/0075; B81B 2201/0235; B81B 2201/0264; B81B 2203/0307; B81C 1/00698

See application file for complete search history.

(56) References Cited

U.S. PATENT DOCUMENTS

| | | | |
|---|---|---|---|
| 2010/0021379 A1 | 1/2010 | Lam et al. | |
| 2011/0109327 A1* | 5/2011 | Franke | G01P 15/125 324/658 |
| 2013/0200473 A1* | 8/2013 | Classen | G01P 15/0802 257/415 |
| 2018/0238929 A1* | 8/2018 | Isobe | G01P 15/097 |

FOREIGN PATENT DOCUMENTS

| | | |
|---|---|---|
| DE | 19756849 A1 | 7/1998 |
| DE | 102011006412 A1 | 10/2012 |

* cited by examiner

*Primary Examiner* — Khaja Ahmad
*Assistant Examiner* — Sun Mi Kim King
(74) *Attorney, Agent, or Firm* — NORTON ROSE FULBRIGHT US LLP; Gerard A. Messina (57) ABSTRACT

A micromechanical component for a sensor device, including a seismic mass, which is situated at and/or in a mounting and which includes a first electrode area, a second electrode area electrically insulated from the first electrode area, and a connecting area made up of at least one electrically insulating material. The first electrode area and the second electrode area each mechanically contact the connecting area and are connected to one another via the connecting area. At least one first conductive area of the first electrode area and a second conductive area of the second electrode area are structured out of a first semiconductor and/or metal layer. The first electrode area also includes a third conductive area. The second electrode area also includes a fourth conductive area. The third conductive area and the fourth conductive area are structured out of a second semiconductor and/or metal layer.

14 Claims, 7 Drawing Sheets

MICROMECHANICAL COMPONENT FOR A SENSOR DEVICE

FIELD

The present invention relates to a micromechanical component for a sensor device. The present invention also relates to a manufacturing method for a micromechanical component for a sensor device.

BACKGROUND INFORMATION

Figure 1:
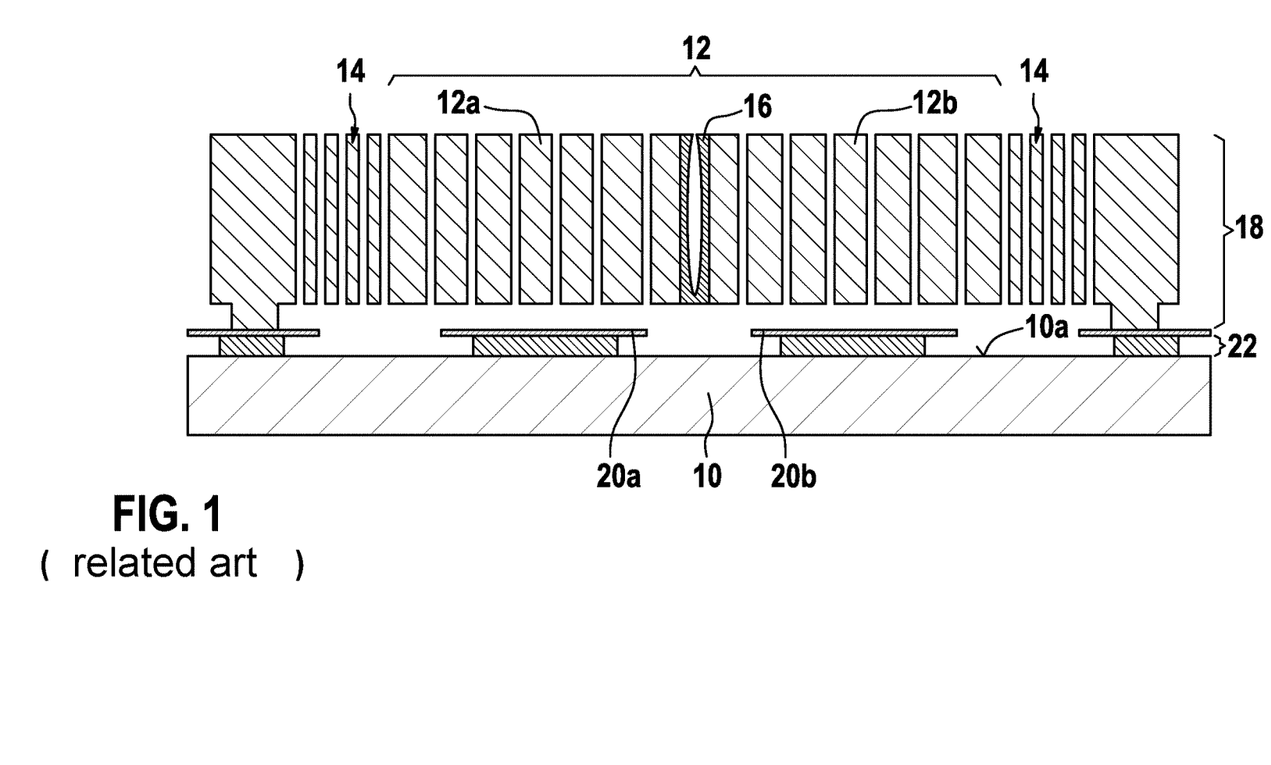
FIG. 1 shows a schematic representation of a conventional rotation rate sensor.

FIG. 1 shows a schematic representation of a conventional rotation rate sensor which is internal related art of the applicant.

The conventional rotation rate sensor schematically shown in FIG. 1 has a substrate 10 including a substrate surface 10a at which a seismic mass 12 is connected via at least one spring 14 in such a way that seismic mass 12 may be displaced with respect to substrate 10. With the aid of an insulating area 16 extending through seismic mass 12 along a direction oriented perpendicularly to substrate surface 10a, seismic mass 12 is divided into a first electrode area 12a and into a second electrode area 12b. First electrode area 12a and second electrode area 12b (together with the at least one spring 14) are thus structured out of a single semiconductor layer 18. The conventional rotation rate sensor additionally also includes a first counter electrode 20a situated adjoining first electrode area 12a and a second counter electrode 20b situated adjoining second electrode area 12b, first counter electrode 20a and second counter electrode 20b being fixed on an insulating layer 22 at least partially covering substrate surface 10a.

SUMMARY

The present invention provides a micromechanical component for a sensor device, and a manufacturing method for a micromechanical component for a sensor device.

The present invention provides micromechanical components which may be used, in each case, in a sensor device, such as for example a rotation rate sensor, or in an actuator device. The micromechanical components according to an example embodiment of the present invention have a comparatively high fracture resistance, even during overload. Moreover, the micromechanical components according to an example embodiment of the present invention are manufacturable with the aid of relatively little effort, while maintaining a reliable quality. The micromechanical components according to an example embodiment of the present invention may thus also be manufactured very cost-effectively.

Since the micromechanical components according to an example embodiment of the present invention have a comparatively simple configuration, they are relatively easily miniaturizable. The micromechanical components may therefore be used in a versatile manner. Furthermore, the micromechanical components according to the present invention may be manufactured while carrying out conventional processes of semiconductor technology. The manufacturing method according to the present invention for a micromechanical component is therefore easily integratable into manufacturing processes already being used.

In one advantageous specific embodiment of the micromechanical component of the present invention, a first separating trench, structured through the first semiconductor and/or metal layer, is formed between the first conductive area and the second conductive area, and a second separating trench, structured through the second semiconductor and/or metal layer, is formed between the third conductive area and the fourth conductive area, a first center plane which extends centrally through the first separating trench being oriented in parallel to and at a distance not equal to zero from a second center plane which extends centrally through the second separating trench, a first opening of the first separating trench, which is oriented to the third conductive area and the fourth conductive area, and a second opening of the second separating trench, which is oriented to the first conductive area and the second conductive area, opening at a connecting trench which is free of the at least one material of the second semiconductor and/or metal layer. In this case, at least the connecting trench is preferably at least partially filled with the at least one electrically insulating material of the connecting area. With the aid of the configuration of the connecting area described here, it is reliably ensurable that the second electrode area electrically separate/insulated from the first electrode area nonetheless remains mechanically connected to the first electrode area with a high fracture resistance. Despite the potential isolation between the first electrode area and the second electrode area of the seismic mass, the seismic mass may thus be utilized in a versatile manner.

For example, the first separating trench, along its first center plane, and the second separating trench, along its second center plane, extend from a first side of the seismic mass to a second side of the seismic mass. In this case, the first conductive area and the second conductive area, both on the first side of the seismic mass and on the second side of the seismic mass, are in each case configured adjoining the first separating trench including a protruding separating trench edge area, the connecting trench, adjoining the second separating trench, both on the first side of the seismic mass and on the second side of the seismic mass, in each case perforating a side wall of the third conductive area and the fourth conductive area, respectively, and a protruding edge of the connecting area protruding from the at least one electrically insulating material at the perforated side walls of the third conductive area and the fourth conductive area, respectively, the protruding edges of the connecting area covering the protruding separating trench edge areas of the first conductive area and the second conductive area. As becomes apparent based on the following description, it is possible to ensure, with the aid of the configuration of the connecting area described here, including the protruding edge made up of the at least one electrically insulating material, during the structuring of the seismic mass out of the first semiconductor and/or metal layer and out of the second semiconductor and/or metal layer, that no residues lead to an undesirable short circuit between the first electrode area and the second electrode area electrically separate/insulated therefrom.

In accordance with an example embodiment of the present invention, it may also be advantageous when the first separating trench, along its first center plane, extends from a nose area which protrudes on the first side of the seismic mass at the protruding edge of the connecting area and is made up of the at least one electrically insulating material of the connecting area to a nose area which protrudes on the second side of the seismic mass at the protruding edge of the connecting area and is made up of the at least one electrically insulating material of the connecting area. The protruding nose areas described here also help to prevent an undesirable short circuit between the first electrode area and the second electrode area electrically separate/insulated therefrom.

In one further advantageous specific embodiment of the micromechanical component of the present invention, the at least one electrically insulating material of the connecting area in each case has an electrical conductivity of less than-equal to $10^{-8}$ S·cm$^{-1}$ and/or a specific resistance of greater than-equal to $10^8$ Ω·cm. This makes it possible to apply different electrical potentials to the first electrode area and the second electrode area of the seismic mass.

For example, the at least one electrically insulating material of the connecting area may be silicon-rich silicon nitride. An essential advantage of silicon-rich silicon nitride is its high etching resistance to etching materials which are typically used for etching a silicon dioxide used as sacrificial material. During a use of silicon-rich silicon nitride as the at least one electrically insulating material, it may thus be prevented that the connecting area is undesirably also (essentially) etched during an etching of the silicon dioxide used as sacrificial material.

The above-described advantages may also be ensured when a corresponding manufacturing method for a micromechanical component for a sensor device or actuator device is carried out. It is expressly pointed out that the manufacturing method may be refined according to the above-described specific embodiments of the micromechanical component.

In one advantageous specific embodiment of the manufacturing method of the present invention, after the structuring of the first separating trench with a maximum extension oriented perpendicularly to the first center plane, the at least one electrically insulating material of the later connecting area is deposited onto at least sub-surfaces of the later first conductive area and of the later second conductive area with a minimum layer thickness, the minimum layer thickness being greater than, by at least a factor of 2, or equal to the maximum extension of the first separating trench perpendicular to the first center plane. In this way, it may be reliably ensured that the first separating trench is also (almost) completely filled with the at least one electrically insulating material during the deposition of the at least one electrically insulating material of the later connecting area.

As an alternative or in addition, the first separating trench, a first subarea of the connecting trench situated adjoining the first opening of the first separating trench, and a second subarea of the connecting trench situated adjoining the second opening of the second separating trench may be filled with at least one sacrificial material, while a residual area of the connecting trench situated between the first subarea and the second subarea is filled with the at least one electrically insulating material of the later connecting area, the at least one sacrificial material being at least partially removed with the aid of an etching medium, whose etching rate for the at least one sacrificial material is in each case greater by at least a factor of 2 than for the at least one electrically insulating material of the later connecting area. In this way, the connecting area may be configured, in a targeted manner, to be so "small" that it only forms a very low electrical capacitance between the first electrode area and the second electrode area due to its reduced contact surfaces with the first electrode area and the second electrode area.

BRIEF DESCRIPTION OF THE DRAWINGS

Further features and advantages of the present invention are described hereafter based on the figures.

FIGS. 2AA through 2DC show schematic representations for explaining a first specific embodiment of the manufacturing method, in accordance with the present invention.

DETAILED DESCRIPTION OF EXAMPLE EMBODIMENTS

Figure 2:
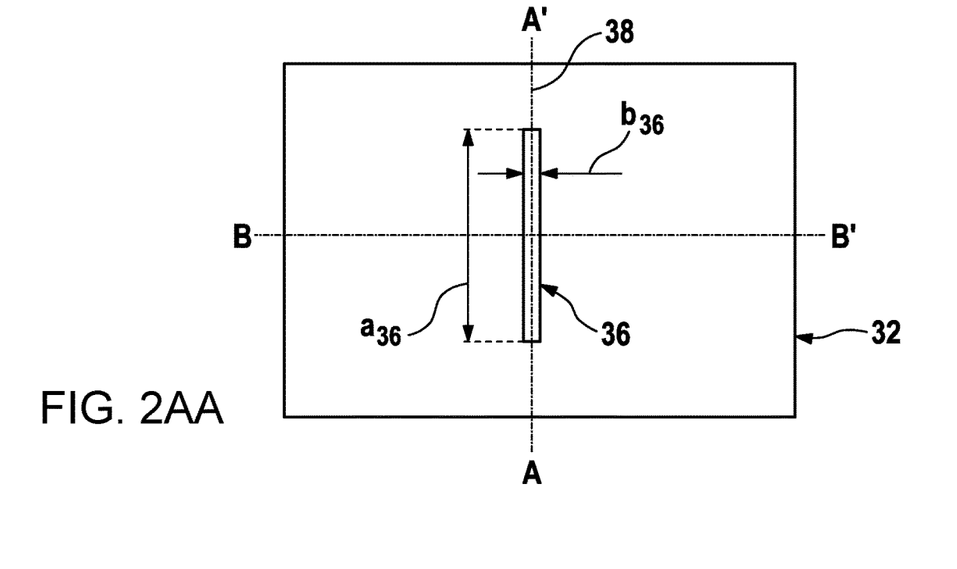

FIGS. 2AA through 2DC show schematic representations for explaining a first specific embodiment of the manufacturing method, FIGS. 2AA through 2DA showing top views onto intermediate products, FIGS. 2AB through 2DB showing cross-sections along a line AA' of FIGS. 2AA through 2DA, and FIGS. 2AC through 2DC showing cross-sections along a line BB' of FIGS. 2AA through 2DA oriented perpendicularly to line AA'. During the manufacturing method described hereafter, a seismic mass is formed at and/or in a mounting 30 of the micromechanical component in such a way that the seismic mass is deformable and/or displaceable with respect to mounting 30. By way of example, mounting 30 in the specific embodiment described here includes/is a substrate 30 including a substrate surface 30a. Substrate 30 is preferably a semiconductor substrate, such as in particular a silicon substrate. As an alternative or in addition to silicon, however, substrate 30 may also include at least one other semiconductor material, at least one metal and/or at least one insulator.

The seismic mass is designed with a first electrode area, a second electrode area electrically insulated from the first electrode area, and a connecting area made up of at least one electrically insulating material. A first conductive area of the first electrode area and a second conductive area of the second electrode area are structured out of a first semiconductor and/or metal layer 32. FIG. 2AA shows a top view onto first semiconductor and/or metal layer 32. First semiconductor and/or metal layer 32 may be a silicon layer/polysilicon layer, for example. However, it is pointed out that an ability to carry out the manufacturing method described here is not limited to the formation of the first conductive area and of the second conductive area of silicon.

By way of example, first semiconductor and/or metal layer 32 is deposited onto at least one intermediate layer 34 at least partially covering substrate surface 30a of substrate 30 in the specific embodiment of the manufacturing method described here. FIGS. 2AB and 2AC show only one sacrificial layer 34 made up of at least one sacrificial material, such as, in particular, silicon dioxide, as the at least one intermediate layer 34. Optionally, however, it is additionally possible for an electrode and/or strip conductor layer (e.g., for at least one later counter electrode) and/or a functional layer other than the at least one intermediate layer 34 to be formed on substrate surface 30a. It is also pointed out here that a silicon on insulator (SOI) substrate may also be used as the starting material for a layer sequence made up of substrate 30, sacrificial layer 34, and first semiconductor and/or metal layer 32. If desired, at least one contact area may also be structured through sacrificial layer 34.

FIGS. 2AA through 2AC show an intermediate product after a structuring of first separating trench 36 through first semiconductor and/or metal layer 32. First separating trench 36 shall be understood to mean a first separating trench 36 extending through first semiconductor and/or metal layer 32.

As is shown in FIG. 2AA, first separating trench 36 is structured between the later first conductive area and the later second conductive area through first semiconductor and/or metal layer 32 in such a way that a first center plane 38 extends centrally through first separating trench 36. By way of example, line AA' is situated in first center plane 38 of first separating trench 36. Along first center plane 38, first separating trench 36 is structured with a first maximum extension $a_{36}$ through first semiconductor and/or metal layer 32, which is considerably greater than a second maximum extension $b_{36}$ of first separating trench 36 perpendicular to its first center plane 38. First maximum extension $a_{36}$ of first separating trench 36 may, e.g., be greater by at least a factor of 5 than second maximum extension $b_{36}$ of first separating trench 36.

As is illustrated in FIGS. 2BA through 2BC, the at least one electrically insulating material of the later connecting area 40 is deposited onto at least sub-surfaces of the later first conductive area and of the later second conductive area after first separating trench 36 has been structured. The at least one electrically insulating material of the later connecting area 40 is preferably deposited onto at least the sub-surfaces with a minimum layer thickness $d_{40}$ which is greater than, by at least a factor of 2, or equal to second maximum extension $b_{36}$ of first separating trench 36 perpendicular to its center plane 38. In this way, it may be ensured that first separating trench 36 is completely filled with the at least one electrically insulating material of the later connecting area 40.

Preferably, the at least one electrically insulating material of connecting area 40 in each case has an electrical conductivity of less than-equal to $10^{-8}$ S·cm$^{-1}$, or the at least one electrically insulating material has a specific resistance of greater than-equal to $10^{8}$ Ω·cm. It is also advantageous when the at least one electrically insulating material in each case has an etching rate with respect to at least one etching medium which is smaller, by at least a factor of 2, than an etching rate of the at least one etching medium for the at least one sacrificial material. The at least one electrically insulating material of connecting area 40 may, e.g., be silicon-rich silicon nitride.

FIGS. 2BA through 2BC show an intermediate product after a structuring of the at least one electrically insulating material of the later connecting area 40, using an etching mask 42 whose first maximum extension $a_{42}$ along or parallel to first center plane 38a of first separating trench 36 is smaller than first maximum extension $a_{36}$ of first separating trench 36 along its center plane 38. A first edge area 36a at a first end of first separating trench 36 and a second edge area 36b at a second end of first separating trench 36 are thus free of etching mask 42, which is why the at least one electrically insulating material filled into edge areas 36a and 36b is also partially etched during the structuring. However, the structuring is only carried out until the at least one electrically insulating material filled into subareas 36a and 36b still remains in residual areas 36a and 36b with a minimum height $h_{40a}$. This may also be described in such a way that protruding nose areas 40a are formed at the later connecting area 40 in edge areas 36a and 36b of first separating trench 36.

Etching mask 42, perpendicular to first center plane 38, has a second maximum extension $b_{42}$ which is considerably larger than second maximum extension $a_{42}$ of first separating trench 36. Second maximum extension $b_{42}$ of etching mask 42 may, e.g., be greater than second maximum extension $b_{36}$ of first separating trench 36 by at least a factor of 5. The advantages of such a design of etching mask 42 will also become apparent based on the following figures.

Etching mask 42 is removed after the at least one electrically insulating material of connecting area 40 has been structured. Thereafter, a second semiconductor and/or metal layer 44 is deposited over first semiconductor and/or metal layer 32 and connecting area 40. Second semiconductor and/or metal layer 44 may, in particular, be a silicon layer/polysilicon layer. Instead of or in addition to silicon/polysilicon, second semiconductor and/or metal layer 44, however, may also include at least one other semiconductor material and/or at least one metal.

FIGS. 2CA through 2CC show an intermediate product after a joint structuring of second semiconductor and/or metal layer 44 and first semiconductor and/or metal layer 32 in such a way that first conductive area 32a and second conductive area 32b are structured out of first semiconductor and/or metal layer 32, and a third conductive area 44a, mechanically contacting first conductive area 32a, and a fourth conductive area 44b, mechanically contacting second conductive area 32b, are structured out of second semiconductor and/or metal layer 44. A trenching method may be carried out, for example, for jointly structuring out conductive areas 32a, 32b, 44a and 44b. Since semiconductor and/or metal layers 32 and 44 are structured together during the manufacturing method described here, the etching method/trench method to be carried out for this purpose is hardly more labor-intensive than a conventional structuring of two electrically separate electrodes/electrode areas out of a shared semiconductor and/or metal layer.

With the aid of the joint structuring of first semiconductor and/or metal layer 32 and second semiconductor and/or metal layer 44, first electrode area 46a of seismic mass 48 and second electrode area 46b of seismic mass 48 are formed in such a way that first electrode area 46a also includes third conductive area 44a, in addition to first conductive area 32a, while second electrode area 46b is also formed with fourth conductive area 44b, in addition to second conductive area 32b. Moreover, first electrode area 46a and second electrode area 46b in each case mechanically contact connecting area 40, and are thus connected to one another via connecting area 40. Seismic mass 48 encompassing first electrode area 46a, second electrode area 46b and connecting area 40 therefore has a sufficient fracture resistance for use of the micromechanical component manufactured with the aid of seismic mass 48 for a sensor device.

During the joint structuring-out of conductive areas 32a, 32b, 44a and 44b, additionally a second separating trench 50 is structured through second semiconductor and/or metal layer 44 between third conductive area 44a and fourth conductive area 44b, while first separating trench 36a runs between first conductive area 32a and second conductive area 32b. Second separating trench 50 shall be understood to mean a second separating trench 50 extending through second semiconductor and/or metal layer 44. Moreover, second separating trench 50 is structured through second semiconductor and/or metal layer 44 in such a way that first center plane 38 extending centrally through first separating trench 36 is oriented in parallel to and at a distance Δ not equal to zero from a second center plane 52 extending centrally through second separating trench 50. For seismic mass 48, a first side 48a and a second side 48b may thus be defined in such a way that first separating trench 36, along its first center plane 38, and second separating trench 50, along its second center plane 52, extend from first side 48a of seismic mass 48 to second side 48b of seismic mass 48b. In addition, distance Δ is smaller than second maximum extension $b_{42}$ of etching mask 42 perpendicular to first center plane 38 and second center plane 52, and is selected in such a way that second separating trench 50 extends to connecting area 40. Distance Δ between first center plane 38 and second center plane 52 is preferably greater than-equal to half the maximum layer thickness $d_{32}$ of first semiconductor and/or metal layer 32 which is oriented perpendicularly to substrate surface 30a. In addition, it is advantageous when distance Δ is greater than, by at least a factor of 2, or equal to a sum of second maximum extension $b_{36}$ of first separating trench 36 perpendicular to its first center plane 38, and a maximum extension $b_{50}$ of second separating trench 50 perpendicular to its first center plane 52.

It is shown in FIG. 2CC that, when the manufacturing method described here is carried out, a connecting trench 54 which is free of the at least one material of second semiconductor and/or metal layer 44 is also formed in such a way that a first opening of first separating trench 36, which is oriented to third conductive area 44a and fourth conductive area 44b, and a second opening of second separating trench 50, which is oriented to first conductive area 32a and second conductive area 32b, open at connecting trench 54. Moreover, when the manufacturing method described here is carried out, at least connecting trench 54 is at least partially filled with the at least one electrically insulating material of the connecting area.

As is illustrated in FIG. 2CA, during the joint structuring-out, conductive areas 32a, 32b, 44a and 44b are formed with no more than a first maximum extension $a_{32+44}$ along or in parallel to first center plane 38 and second center plane 52 which is smaller than first maximum extension $a_{42}$ of former etching mask 42 along or in parallel to first center plane 38a and second center plane 52. A (not outlined) masking during the joint structuring-out of conductive areas 32a, 32b, 44a and 44b is selected in such a way that, after the joint structuring-out, connecting trench 54 adjoining separating trench 50, both on first side 48a of seismic mass 48 and on second side 48b of seismic mass 48, in each case perforates a side wall of third conductive area 44a and fourth conductive area 44b, respectively. After the joint structuring-out, connecting area 40, on first side 48a of seismic mass 48 and on second side 48b of seismic mass 48, thus in each case includes an edge 40b which protrudes at the perforated side walls of third conductive area 44a and of fourth conductive area 44b and is made of the at least one electrically insulating material. At each of protruding edges 40b, additionally one of protruding nose areas 40a described above is in each case designed in such a way that first separating trench 36, along its first center plane 38, extends from a nose area 40a which protrudes on first side 48a of seismic mass 48 at the respective protruding edge 40b of connecting area 40 to a nose area 40a which protrudes on second side 48b of seismic mass 48 at the respective protruding edge 40b of connecting area 40.

The joint structuring-out of conductive areas 32a, 32b, 44a and 44b is stopped at protruding areas 40a and 40b of connecting area 40, and at the at least one exposed sacrificial material of sacrificial layer 34. Due to protruding edges 40b of connecting area 40, first conductive area 32a and second conductive area 32b, both on first side 48a of seismic mass 48 and on second side 48b of seismic mass 48, are in each case, adjoining first separating trench 36, configured with a protruding separating trench edge area 56a and 56b (see FIG. 4A), protruding edges 40b of connecting area 40 covering protruding separating trench edge areas 56a and 56b of first conductive area 32a and of second conductive area 32b.

The formation of protruding edges 40b of connecting area 40 at seismic mass 48 facilitates the joint structuring-out of conductive areas 32a, 32b, 44a and 44b, while avoiding a short circuit at seismic mass 48. If seismic mass 48 were designed without protruding edges 40b of connecting area 40, perpendicular etching trenches including completely smooth etching walls would have to be structured over the entire height of first semiconductor and/or metal layer 32 and second semiconductor and/or metal layer 44 during the joint structuring-out, since otherwise undesirable short circuits could occur due to material residues. A design of seismic mass 48 without protruding edges 40b of connecting area 40 would necessitate a compliance with hardly realizable accuracies during the joint structuring-out of conductive areas 32a, 32b, 44a and 44b.

Despite protruding edges 40b of connecting area 40, protruding nose areas 40a of connecting areas 40 ensure that no short circuit caused by a material residue occurs in the area of one of protruding edges 40b, despite the formation of protruding edges 40b. Even when the overhang of protruding edges 40b is comparatively large, the desired potential isolation is ensured by protruding nose areas 40a of connecting area 40.

FIGS. 2DA through 2DC show the micromechanical component after the at least partial removal of the at least one sacrificial material of sacrificial layer 34, by which seismic mass 48 is exposed. The at least partial removal of the at least one sacrificial material of sacrificial layer 34 is preferably carried out with the aid of at least one etching medium, whose respective etching rate for the at least one sacrificial material is in each case greater by at least a factor of 2 than its etching rate for the at least one electrically insulating material of connecting area 40. This is ensured, for example, when hydrofluoric acid (HF) is used for etching silicon dioxide as the (only) sacrificial material of sacrificial layer 34, while connecting area 40 is made up of silicon-rich silicon nitride.

Figure 3A:
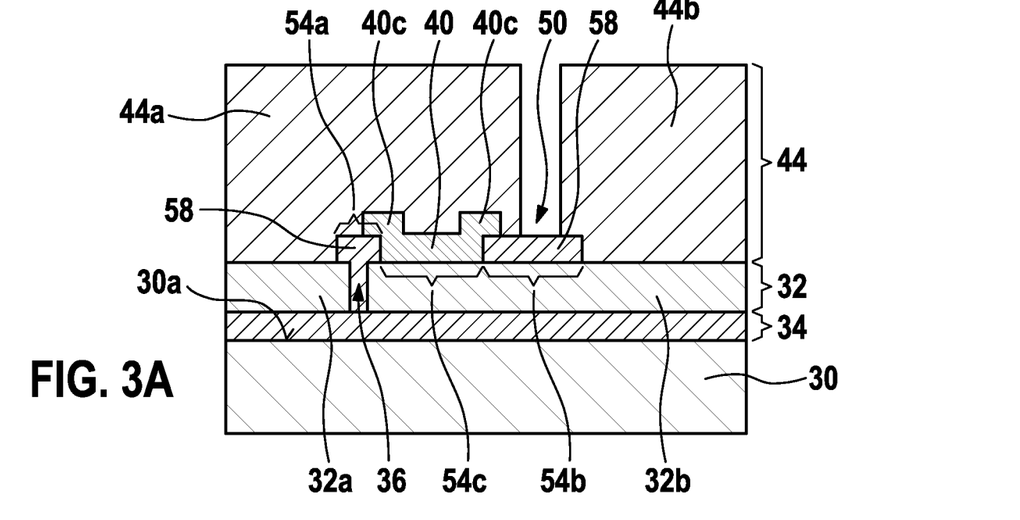
FIGS. 3A and 3B show schematic representations for explaining a second specific embodiment of the manufacturing method, in accordance with the present invention.
Figure 3B:
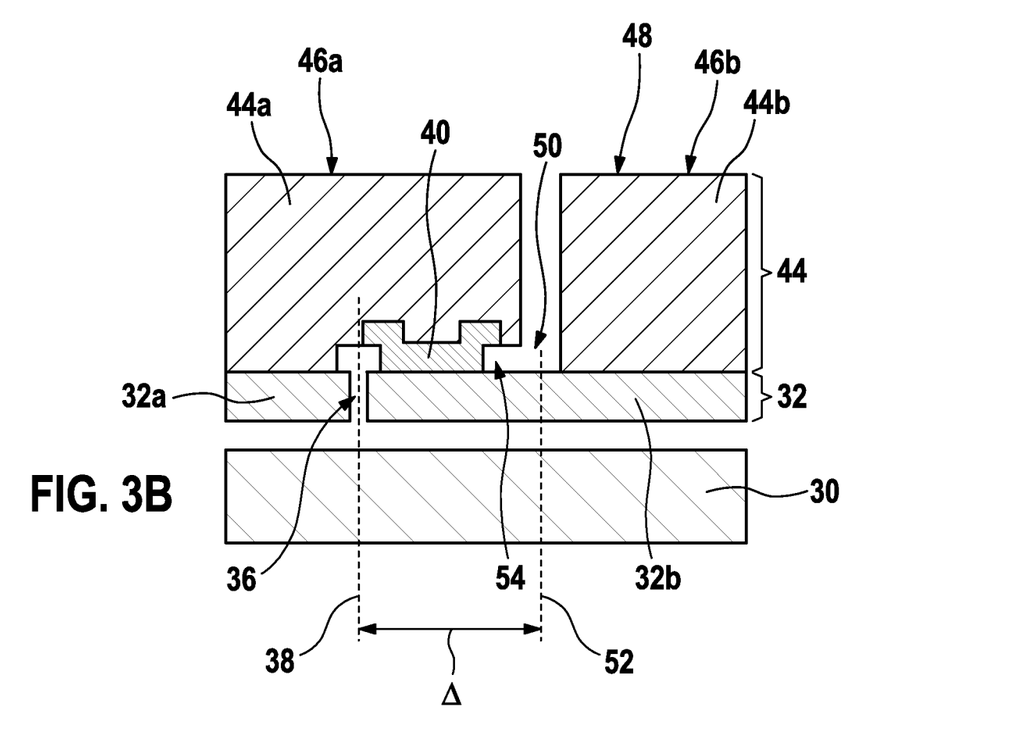

FIGS. 3A and 3B show schematic representations for explaining a second specific embodiment of the manufacturing method.

As is shown in FIG. 3A, in the manufacturing method described here, first separating trench 36, a first subarea 54a of connecting trench 54 situated adjoining the first opening of first separating trench 36, and a second subarea 54b of connecting trench 54 situated adjoining the second opening of second separating trench 50 are filled with at least one sacrificial material 58, while a residual area 54c of connecting trench 54 situated between first subarea 54a and second subarea 54b is filled with the at least one electrically insulating material of the later connecting area 40. As an optional refinement, it is also possible for a first interface between the at least one sacrificial material 58 filled into first subarea 54a and the at least one electrically insulating material, and a second interface between the at least one sacrificial material 58 filled into second subarea 54b and the at least one electrically insulating material, to be covered in each case with a strip 40c of the at least one electrically insulating material of the later connecting area 40.

Thereafter, sacrificial material 58 is at least partially removed with the aid of an etching medium, whose etching rate for sacrificial material 58 is greater by at least a factor of 2 than for the at least one electrically insulating material of the later connecting area 40. This is illustrated in FIG. 3B. After the at least one sacrificial material 58 has been completely or partially removed, connecting area 40 only contacts first electrode area 46a and second electrode area 46b across a comparatively small surface area. Even when the at least one electrically insulating material of connecting area 40 has a comparatively high dielectric constant, a relatively low electrical capacitance is thus nonetheless achieved between the two electrode areas 46a and 46b. The manufacturing method described here is thus suitable for forming potential isolations having only a comparatively low electrical capacitance.

With respect to further method steps of the manufacturing method of FIGS. 3A and 3B and their advantages, reference is made to the preceding specific embodiment of FIGS. 2AA through 2DC.

Figure 4A:
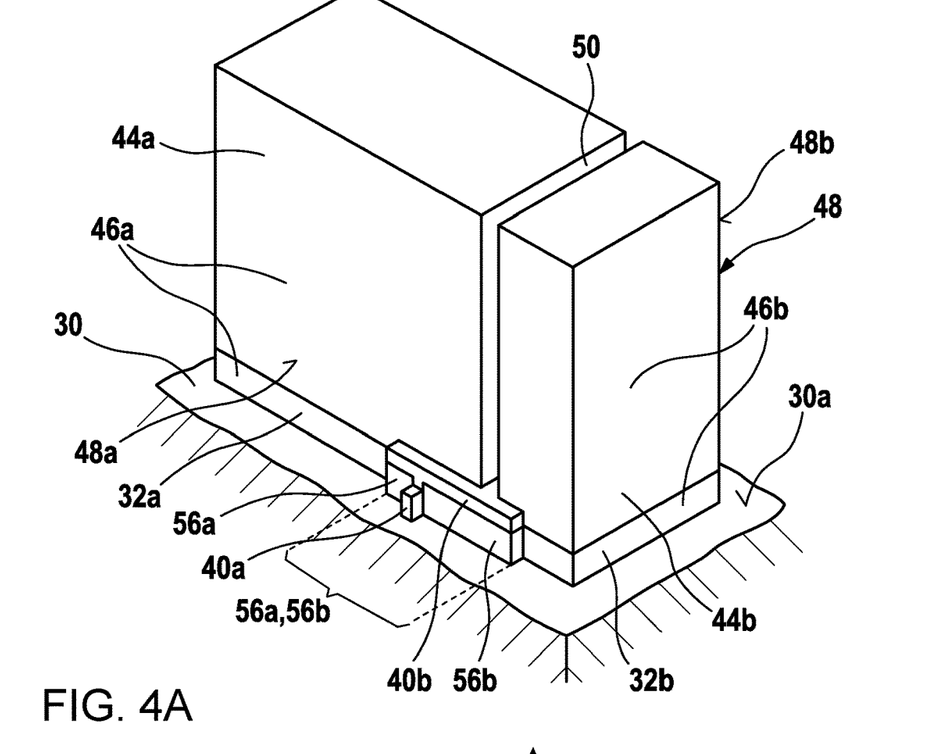
FIGS. 4A and 4B show schematic representations of one specific embodiment of the micromechanical component, in accordance with the present invention.
Figure 4B:
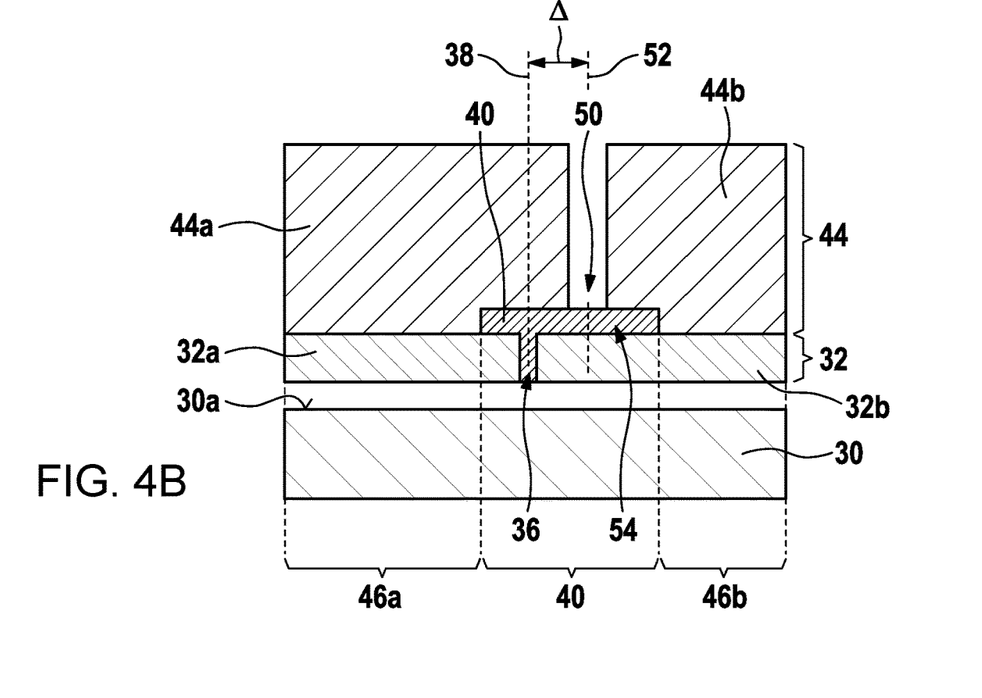

FIGS. 4A and 4B show schematic representations of a specific embodiment of the micromechanical component.

The micromechanical component schematically shown in FIGS. 4A and 4B includes a mounting 30 and a seismic mass 48 which is situated at and/or in mounting 30 and which is deformable and/or displaceable with respect to mounting 30. Seismic mass 48 includes a first electrode area 46a, a second electrode area 46b electrically insulated from the first electrode area 46a, and a connecting area 40 made up of at least one electrically insulating material. First electrode area 46a and second electrode area 46b in each case mechanically contact connecting area 40, and are connected to one another via connecting area 40. As is shown in FIGS. 4A and 4B, (at least) one first conductive area 32a of first electrode area 46a and a second conductive area 32b of second electrode area 46b are structured out of a first semiconductor and/or metal layer 32. For this purpose, a first separating trench 36, structured through first semiconductor and/or metal layer 32, is formed between first conductive area 32a and second conductive area 32b. Moreover, first electrode area 46a additionally includes a third conductive area 44a mechanically contacting first conductive area 32a, while second electrode area 46b additionally includes a fourth conductive area 44b mechanically contacting second conductive area 32b. In addition, third conductive area 44a and fourth conductive area 44b are structured out of a second semiconductor and/or metal layer 44. Accordingly, a second separating trench 50, structured through second semiconductor and/or metal layer 44, is formed between third conductive area 44a and fourth conductive area 44b. Separating trenches 36 and 50 are designed in such a way that a first center plane 38 extending centrally through first separating trench 36 is oriented in parallel to and at a distance Δ not equal to zero from a second center plane 52 extending centrally through second separating trench 50. First separating trench 36 (along its first center plane 38) and second separating trench 50 (along its second center plane 52) thus both extend from a first side 48a of seismic mass 48 to a second side 48b of seismic mass 48.

As is shown in FIG. 4B, a first opening of first separating trench 36, which is oriented to third conductive area 44a and fourth conductive area 44b, and a second opening of second separating trench 50, which is oriented to first conductive area 32a and second conductive area 32b, open at a connecting trench 54 which is free of the at least one material of second semiconductor and/or metal layer 44. At least connecting trench 54 is at least partially filled with the at least one electrically insulating material of connecting area 40. The micromechanical component of FIGS. 4A and 4B thus has a comparatively high fracture resistance, even during overload.

The micromechanical component of FIGS. 4A and 4B is manufactured with the aid of the manufacturing method of FIGS. 2AA through 2DC. This is apparent, for example, from the fact that first conductive area 32a and second conductive area 32b, both on first side 48a of seismic mass 48 and on second side 48b of seismic mass 48, are in each case configured with a protruding separating trench edge area 56a and 56b, adjoining first separating trench 36. In addition, separating trench 54, adjoining second separating trench 50, both on first side 48a of seismic mass 48 and on second side 48b of seismic mass 48, in each case perforates a respective side wall of third conductive area 44a and of fourth conductive area 44b, respectively, a protruding edge 40b of connecting area 40 made of the at least one electrically conductive material protruding at the perforated side walls of third conductive area 44a and of fourth conductive area 44b, respectively. Protruding edges 40b of connecting area 40 additionally cover the protruding separating trench edge areas 56a and 56b of first conductive area 32a and of second conductive area 32b. Furthermore, first separating trench 36, along its first center plane 38, extends from a nose area 40a of connecting area 40 which protrudes on first side 48a of seismic mass 48 at protruding edge 40b of connecting area 40 and is made up of the at least one electrically insulating material of the connecting area to a nose area 40a of connecting area 40 which protrudes on second side 38b of seismic mass 48 at protruding edge 40b of connecting area 40 and is made up of the at least one electrically insulating material.

With respect to further features and properties of the micromechanical component of FIGS. 4A and 4B and their advantages, reference is made to the manufacturing methods described above.

The micromechanical component of FIGS. 4A and 4B and the micromechanical components manufactured with the aid of the above-described manufacturing methods may in each case advantageously be used for a sensor device. Such a sensor device may, for example, be an acceleration sensor, a rotation rate sensor, or a pressure sensor. The micromechanical components may also be used for an actuator device, such as e.g., a micromirror or an optical switch.

What is claimed is:

1. A micromechanical component for a sensor device, comprising:
    a mounting; and
    a seismic mass that is situated at and/or in the mounting, is deformable and/or displaceable relative to the mount, and includes:
        a first electrode area;
        a second electrode area that is electrically insulated from the first electrode area; and
        a connecting area that is made up of at least one electrically insulating material, is in mechanical contact with each of the first electrode area and the second electrode area, and connects the first and second electrode areas to each other;
    wherein:
        the first electrode area includes a first conductive area structured out of a first semiconductor and/or metal layer;
        the second electrode area includes a second conductive area structured out of the first semiconductor and/or metal layer;
        the first electrode area additionally includes a third conductive area that is in mechanical contact with the first conductive area and that is structured out of a second semiconductor and/or metal layer;
        the second electrode area additionally includes a fourth conductive area that is in mechanical contact with the second conductive area and that is structured out of the second semiconductor and/or metal layer; and the connecting area is arranged partly over at least a part of the first conductive area, between the first and third conductive areas, and partly over at least a part of the second conductive area, between the second and fourth conductive areas.

2. The micromechanical component as recited in claim 1, wherein:
a first separating trench, structured through the first semiconductor and/or metal layer, is formed between the first conductive area and the second conductive area;
a second separating trench, structured through the second semiconductor and/or metal layer, is formed between the third conductive area and the fourth conductive area;
a first center plane, which extends centrally through the first separating trench, is oriented in parallel to, and at a distance from, a second center plane, which extends centrally through the second separating trench;
(a) an end of the first separating trench, that faces in a direction towards at least one plane in which the third and fourth conductive areas are arranged and (b) an end of the second separating trench that faces in a direction towards at least one plane in which the first and second conductive areas are arranged each opens to a connecting trench that:
is free of material of the second semiconductor and/or metal layer; and
is at least partially filled with the at least one electrically insulating material of the connecting area.

3. The micromechanical component as recited in claim 1, wherein each of the at least one electrically insulating material of the connecting area has an electrical conductivity of less than-equal to $10^{-8}$ S·cm$^{-1}$ and/or a specific resistance of greater than-equal to $10^8$ Ω·cm.

4. The micromechanical component as recited in claim 1, wherein the at least one electrically insulating material of the connecting area is silicon-rich silicon nitride.

5. The micromechanical component as recited in claim 1, wherein the at least one electrically insulating material of the connecting area is present on respective surfaces of the parts of the first and second conductive areas with a minimum layer thickness that is greater, by at least a factor of 2, than a maximum extension of the first separating trench perpendicular to the first center plane.

6. The micromechanical component as recited in claim 1, wherein the at least one electrically insulating material of the connecting area is present on respective surfaces of the parts of the first and second conductive areas with a minimum layer thickness that is at least as great as a maximum extension of the first separating trench perpendicular to the first center plane.

7. A micromechanical component for a sensor device, the micromechanical component comprising:
a mounting; and
a seismic mass that is situated at and/or in the mounting, is deformable and/or displaceable relative to the mount, and includes:
a first electrode area;
a second electrode area that is electrically insulated from the first electrode area; and
a connecting area that is made up of at least one electrically insulating material, is in mechanical contact with each of the first electrode area and the second electrode area, and connects the first and second electrode areas to each other;

wherein:
the first electrode area includes a first conductive area structured out of a first semiconductor and/or metal layer;
the second electrode area includes a second conductive area structured out of the first semiconductor and/or metal layer;
the first electrode area includes a third conductive area that is in mechanical contact with the first conductive area and that is structured out of a second semiconductor and/or metal layer;
the second electrode area includes a fourth conductive area that is in mechanical contact with the second conductive and that is structured out of the second semiconductor and/or metal layer;
a first separating trench, structured through the first semiconductor and/or metal layer, is formed between the first conductive area and the second conductive area;
a second separating trench, structured through the second semiconductor and/or metal layer, is formed between the third conductive area and the fourth conductive area;
a first center plane, which extends centrally through the first separating trench, is oriented in parallel to, and at a distance from, a second center plane, which extends centrally through the second separating trench;
(a) an end of the first separating trench that faces in a direction towards at least one plane in which the third and fourth conductive areas are arranged and (b) an end of the second separating trench that faces in a direction towards at least one plane in which the first and second conductive areas are arranged each opens to a connecting trench that:
is free of material of the second semiconductor and/or metal layer; and
is at least partially filled with the at least one electrically insulating material of the connecting area;
the first separating trench, along its first center plane, and the second separating trench, along its second center plane, extend from a first side of the seismic mass to a second side of the seismic mass;
the first conductive area and the second conductive area, both on the first side of the seismic mass and on the second side of the seismic mass, are each configured with a protruding separating trench edge area adjoining the first separating trench;
the connecting trench adjoins the second separating trench, both on the first side of the seismic mass and on the second side of the seismic mass, in each case perforating a side wall of the third conductive area and of the fourth conductive area, respectively; and
a protruding edge of the connecting area, which is made of the at least one electrically insulating material:
protrudes at the perforated side walls of the third conductive area and of the fourth conductive area, respectively; and
covers the protruding separating trench edge areas of the first conductive area and of the second conductive area.

8. The micromechanical component as recited in claim 7, wherein the first separating trench, along its first center plane, extends (a) from a first nose area of the connecting area, which protrudes on the first side of the seismic mass at the protruding edge of the connecting area and is made up of the at least one electrically insulating material, (b) to a second nose area, which protrudes on the second side of the seismic mass at the protruding edge of the connecting area and is made up of the at least one electrically insulating material of the connecting area.

9. The micromechanical component as recited in claim 7, wherein each of the at least one electrically insulating material of the connecting area has an electrical conductivity of less than-equal to $10^{-8}$ S·cm$^{-1}$ and/or a specific resistance of greater than-equal to $10^8$ Ω·cm.

10. The micromechanical component as recited in claim 7, wherein the at least one electrically insulating material of the connecting area is silicon-rich silicon nitride.

11. A manufacturing method for a micromechanical component for a sensor device, the micromechanical component including a mounting, a seismic mass that (a) is situated at and/or in the mounting, (b) is deformable and/or displaceable relative to the mount, and (c) includes a first electrode area, a second electrode area that is electrically insulated from the first electrode area, and a connecting area that is made up of at least one electrically insulating material, is in mechanical contact with each of the first electrode area and the second electrode area, and connects the first and second electrode areas to each other, wherein the first electrode area includes a first conductive area structured out of a first semiconductor and/or metal layer, wherein the second electrode area includes a second conductive area structured out of the first semiconductor and/or metal layer, wherein the first electrode area additionally includes a third conductive area that is in mechanical contact with the first conductive area and that is structured out of a second semiconductor and/or metal layer, wherein the second electrode area additionally includes a fourth conductive area that is in mechanical contact with the second conductive area and that is structured out of the second semiconductor and/or metal layer, and wherein the connecting area is arranged partly over at least a part of the first conductive area, between the first and third conductive areas, and partly over at least a part of the second conductive area, between the second and fourth conductive areas, the method comprising the following steps:
    forming the seismic mass at and/or in the mounting of the micromechanical component in such a way that the seismic mass is deformable and/or displaceable with respect to mounting; and
    configuring the first electrode area with the third conductive area mechanically contacting the first conductive area, and configuring the second electrode area with the fourth conductive area mechanically contacting the second conductive area, by structuring the third conductive area and the fourth conductive area out of the second semiconductor and/or metal layer.

12. The manufacturing method as recited in claim 11, wherein a first separating trench is structured through the first semiconductor and/or metal layer, between the later configured first conductive area and the later configured second conductive area, and a second separating trench is structured through the second semiconductor and/or metal layer between the later configured third conductive area and the later configured fourth conductive area, a first center plane which extends centrally through the first separating trench being oriented in parallel to and at a distance not equal to zero from a second center plane which extends centrally through the second separating trench, a connecting area which is free of material of the second semiconductor and/or metal layer being configured in such a way that a first opening of the first separating trench, which is oriented to the third conductive area and the fourth conductive area, and a second opening of the second separating trench, which is oriented to the first conductive area and the second conductive area, opening at the connecting trench, at least the connecting trench being at least partially filled with the at least one electrically insulating material of the connecting area.

13. The manufacturing method as recited in claim 12, wherein, after the structuring of the first separating trench with a maximum extension oriented perpendicularly to the first center plane, the at least one electrically insulating material of the later configured connecting area is deposited onto at least sub-surfaces of the later configure first conductive area and of the later configured second conductive area with a minimum layer thickness, the minimum layer thickness being greater than, by at least a factor of 2, or equal to a maximum extension of the first separating trench perpendicular to the first center plane.

14. The manufacturing method as recited in claim 12, wherein the first separating trench, a first subarea of the connecting trench situated adjoining the first opening of the first separating trench, and a second subarea of the connecting trench situated adjoining the second opening of the second separating trench are filled with at least one sacrificial material, while a residual area of the connecting trench situated between the first subarea and the second subarea is filled with the at least one electrically insulating material of the later configured connecting area, the at least one sacrificial material being at least partially removed using an etching medium, whose etching rate for the at least one sacrificial material is in each case greater by at least a factor of 2 than for the at least one electrically insulating material of the later connecting area.

\* \* \* \* \*